United States Patent
Gallo

(10) Patent No.: US 6,610,406 B2
(45) Date of Patent: Aug. 26, 2003

(54) FLAME RETARDANT MOLDING COMPOSITIONS

(75) Inventor: Anthony A. Gallo, Olean, NY (US)

(73) Assignee: Henkel Locktite Corporation, Rocky Hill, CT (US)

( * ) Notice: Subject to any disclaimer, the term of this patent is extended or adjusted under 35 U.S.C. 154(b) by 0 days.

(21) Appl. No.: 10/097,153

(22) Filed: Mar. 13, 2002

(65) Prior Publication Data

US 2002/0143091 A1 Oct. 3, 2002

Related U.S. Application Data

(63) Continuation-in-part of application No. 09/532,423, filed on Mar. 23, 2000, now Pat. No. 6,432,540.
(60) Provisional application No. 60/311,784, filed on Aug. 10, 2001.

(51) Int. Cl.$^7$ .................. B32B 27/20; C08K 3/22; C08L 63/04
(52) U.S. Cl. ............... 428/413; 427/96; 523/459; 524/406
(58) Field of Search .............. 528/92; 523/459; 524/406; 525/526; 427/96; 428/413

(56) References Cited

U.S. PATENT DOCUMENTS

| | | | |
|---|---|---|---|
| 2,250,483 A | 7/1941 | Hopkinson | 427/343 |
| 2,610,920 A | 9/1952 | Hopkinson | 106/16 |
| 3,897,346 A | 7/1975 | Vogel | 252/8.1 |
| 4,028,333 A | 6/1977 | Lindvay | 524/100 |
| 4,097,287 A | 6/1978 | Ito et al. | 106/14.14 |
| 4,098,748 A | 7/1978 | Moore et al. | 523/200 |
| 4,439,572 A | 3/1984 | Kindrick | 524/405 |
| 4,446,061 A | 5/1984 | Joyce, III et al. | 252/602 |
| 4,753,916 A | 6/1988 | Carcia et al. | 502/321 |
| 4,806,577 A | 2/1989 | Takahashi et al. | 523/445 |
| 4,892,683 A | 1/1990 | Naseem | 252/609 |
| 5,059,640 A | 10/1991 | Hegedus et al. | 523/451 |
| 5,108,732 A | 4/1992 | Krumbe et al. | 423/592 |
| 5,342,553 A | 8/1994 | Schubert | 252/609 |
| 5,422,092 A | 6/1995 | Miyata | 423/635 |
| 5,476,716 A | 12/1995 | Gallo | 428/413 |
| 5,766,568 A | 6/1998 | Kurisu et al. | 423/593 |
| 5,906,679 A | 5/1999 | Watanabe et al. | 106/286.6 |
| 6,190,787 B1 | 2/2001 | Maeda et al. | 428/620 |
| 6,297,306 B1 | 10/2001 | Osada et al. | 524/406 |
| 6,432,540 B1 * | 8/2002 | Gallo | 428/413 |

FOREIGN PATENT DOCUMENTS

| | | | |
|---|---|---|---|
| EP | 0128537 A1 | 12/1984 | C08K/3/22 |
| EP | 0915118 A1 | 5/1999 | C08G/59/62 |
| EP | 0953603 A2 | 11/1999 | C08L/63/00 |
| EP | 1036811 | 9/2000 | |
| EP | 1049152 | 11/2000 | |
| GB | 1102921 | 2/1968 | |
| JP | 54003152 | 1/1979 | |
| JP | 59-182546 | 10/1984 | 524/406 |
| JP | 09059461 | 3/1997 | |
| JP | 11-269348 | 5/1999 | C08L/63/00 |
| JP | 2001098144 | 4/2001 | |
| WO | 0170867 | 9/2001 | |

* cited by examiner

*Primary Examiner*—Richard D. Lovering
(74) *Attorney, Agent, or Firm*—Webb Ziesenheim Logsdon Orkin & Hanson, P.C.

(57) ABSTRACT

Flame retardant molding compositions that are substantially free of halogen, phosphorus, and antimony are disclosed. Also disclosed is the use of these flame retardant molding compositions to coat electronic devices such as integrated circuits. The flame retardant molding compositions include an epoxy resin; a first transition metal oxide containing a refractory metal, such as tungsten trioxide; and a second transition metal oxide containing an oxyanion of a Group VIA element and a cation of a Group IIA element, such as calcium molybdate.

35 Claims, No Drawings

FLAME RETARDANT MOLDING COMPOSITIONS

CROSS REFERENCED TO RELATED APPLICATIONS

This application claims priority to U.S. patent application Ser. No. 60/311,784 filed Aug. 10, 2001, and is a continuation-n-part of U.S. patent application Ser. No. 09/532,423 filed Mar. 23, 2000 now U.S. Pat. No. 6,432,540.

TECHNICAL FIELD OF THE INVENTION

This invention relates to flame retardant molding compositions.

BACKGROUND OF THE INVENTION

Epoxy resin is widely used in molding compounds for coating electronic devices such as integrated circuits. For safety reasons, molding compositions containing epoxy resin often include flame retardants. A common flame retardant system is a combination of bromine containing flame retardants and antimony oxide flame retardant synergists. However, these compounds are pollutants of the environment. Some bromine containing flame retardants (especially brominated diphenyl ethers) are toxic and possibly carcinogenic. As to antimony trioxide, it is classified by the International Agency for Research on Cancer as a Class 2B carcinogen (i.e., antimony trioxide is a suspect carcinogen based mainly on animal studies). In addition, this compound is often used at a relatively high level (2–4%) and is also slightly water-soluble, leading to further environmental concerns. This concern is highlighted by the fact that integrated circuit manufacturers currently discard up to one half of the total amount of molding compositions used as waste product in landfills.

Phosphorus-containing compounds have been proposed as flame retardants. Although they are less hazardous, molding compositions containing these compounds generally possess undesirable properties such as a high moisture absorption rate. Thus, there exists a need to develop new flame retardant molding compositions that do not contain brominated flame retardants, phosphorus-containing compounds, or antimony oxide flame retardant synergists.

SUMMARY OF THE INVENTION

In general, the invention relates to flame retardant molding compositions that are substantially free of halogen, phosphorus, and antimony. In addition to having good flame retarding properties, these compositions form good cull cure in short time periods and absorb low amounts of moisture, and can be used to coat electronic or electrical devices such as semiconductors, diodes, and integrated circuits. Such coated devices demonstrate good electrical reliability at high temperature.

In one aspect, the invention features a flame retardant molding composition that is substantially free of halogen, phosphorus, and antimony. The molding composition includes an epoxy resin, a first transition metal oxide containing a refractory metal, and a second transition metal oxide containing an oxyanion of a Group VIA element.

In a further aspect, the invention relates to a molding composition which is substantially free of halogen, phosphorous and antimony and which includes an epoxy resin, a first transition metal oxide containing a refractory metal, and a second transition metal oxide containing an oxyanion of a Group VIA element and a cation of a Group IIA element, such as calcium molybdate.

In another aspect, the invention features a flame retardant molding composition substantially free of halogen, phosphorus, and antimony, including an epoxy resin, a phenol novalac hardener containing a biphenyl or naphthyl moiety, and a transition metal oxide of a Group VIA element.

In another aspect, the invention features a flame retardant molding composition that is substantially free of halogen, phosphorus, and antimony, including an epoxy resin containing a biphenyl or naphthyl moiety, a phenol novalac hardener, and a transition metal oxide of a Group VIA element.

The invention also features a method of preparing a flame retardant polymer composition that is free of halogen, phosphorus, and antimony. The method includes heating a molding composition to a temperature sufficient to cure the molding composition (e.g., about 150° C. to about 200° C., or about 165° C. to about 195° C.). The molding composition cures in about 1 minute to about 2 minutes, and contains an epoxy resin, a first transition metal oxide containing a refractory metal, and a second transition metal oxide containing an oxyanion of a Group VIA element. In a further embodiment, the second transition metal oxide may include a cation of a Group IIA element. The invention also features polymer compositions formed by this method.

The invention also features a method of coating an electrical or electronic device such as an integrated circuit. The method includes heating a molding composition to a temperature sufficient to cure the molding composition (e.g., about 150° C. to about 200° C., or about 165° C. to about 195° C.). The polymer composition thus formed coats the surface of the device. The molding composition contains an epoxy resin, a first transition metal oxide containing a refractory metal, and a second transition metal oxide containing an oxyanion of a Group VIA element. In a further embodiment, the second transition metal oxide may include a cation of a Group IIA element. The invention also features coated devices prepared by this method.

As used herein, a composition that is "substantially free" of a material means that the amount of the material is negligible in the composition, i.e., less than about 0.001 wt % of the total weight of the composition.

As used herein, a refractory metal is a metal having a melting point of around 2,000° C. or above. Some examples of a refractory metal are zirconium, niobium, molybdenum, ruthenium, iridium, hafnium, tantalum, tungsten, osmium, vanadium, chromium, rhenium, and rhodium.

As used herein, an oxyanion is a polyatomic anion containing oxygen, e.g., molybdate and chromate.

As used herein, a compound is water-insoluble when it has a solubility of less than 0.05 g in 100 ml of water at 25° C.

As used herein, a molding composition is cured when it forms a good cull cure (i.e., strong and not brittle).

Other features and advantages of the invention will be apparent from the description of the preferred embodiments thereof, and from the claims.

DETAILED DESCRIPTION OF THE INVENTION

A preferred molding composition includes an epoxy resin, a hardener, and two transition metal oxides, and optionally a third transition metal oxide.

There is no restriction on the type of epoxy resin that can be used in the molding compositions so long as it contains two or more reactive oxirane groups. Some suitable epoxy resins are epoxy cresol novalac resin, biphenyl epoxy resin, hydroquinone epoxy resin, phenolic novalac epoxy resin, and stilbene epoxy resin: Epoxy cresol novalac resin is preferred. The molding compositions can include more than one epoxy resin, for example, a combination of epoxy cresol novalac resin and biphenyl epoxy resin. The preferred weight percent of the epoxy resin ranges from 4 wt % to about 12 wt %, and more preferably, from about 5.5 wt % to about 8.5 wt %, based on the total weight of the molding composition.

The hardener promotes crosslinking of the molding composition to form a polymer composition. Some suitable hardeners that can be included in the molding compositions are phenol novalac hardener, cresol novalac hardener, dicyclopentadiene phenol hardener, and limonene type hardener. Phenol novalac hardener is preferred. Similar to the epoxy resin component, more than one type of hardener can be included in the molding compositions. The preferred weight percent of the hardener ranges from 1 wt % to about 10 wt %, and more preferably, from about 1.5 wt % to about 6 wt %, based on the total weight of the molding composition.

As to the two transition metal oxides, the first transition metal oxide contains a refractory metal, e.g., chromium, molybdenum, and tungsten, and the second transition metal oxide contains an oxyanion of a Group VIA element, e.g., molybdate and tungstate. While there is no particular restriction on the cation of the second transition metal oxide, it is preferred to be a Group IIB metal cation, e.g., zinc. Both the first and second transition metal oxides are preferred to be water-insoluble. Particularly preferred first and second transition metal oxides are tungsten trioxide and zinc molybdate, respectively.

Alternatively, the cation of the second transition metal oxide may be a Group IIA element. In particular, the cation may be a divalent cation of an alkali earth metal, such as calcium. In such an embodiment, particularly preferred first and second transition metal oxides are tungsten trioxide and calcium molybdate, respectively.

The transition metal oxides are preferred to be in their free form, i.e., they are not associated with materials such as silica or talc. In particular, the transition metal oxides are not present as a coating on an inorganic substance for moisture absorption. The oxides are also preferred to be finely divided, e.g., having a diameter of about 0.1 μm to about 10 μm, preferably, about 0.5 μm to about 5 μm, or more preferably, about 0.5 μm to about 2 μm. The oxides can be obtained commercially, e.g., tungsten trioxide is available from Aldrich Chemical Company (Milwaukee, Wis.) and zinc molybdate and calcium molybdate are available from the Sherwin-Williams Company (Cleveland, Ohio). The molding composition can include, for example, about 0.25 wt % to about 2 wt %, preferably about 0.5 wt % to about 1 wt %, and more preferably about 0.75 wt % of the first transition metal oxide based on the total weight of the molding composition. As to the second transition metal oxide, the molding composition can include, for example, about 0.75 wt % to about 6 wt %, preferably about 1 wt % to about 4 wt %, and more preferably about 3 wt % based on the total weight of the molding composition.

The combination of two separate transition metal oxides provides a synergistic effect, resulting in effective flame retardant properties beyond that seen with either transition metal oxide alone.

The preferred molding compositions can include a third transition metal oxide of Group VIA element. An example of such a metal oxide is molybdenum trioxide. The weight percent of the third transition metal oxide in the molding compositions can range from about 0.1 wt % to about 1 wt %, and preferably about 0.5 wt % to about 1 wt %, and more preferably about 0.75 wt % based on the total weight of the molding composition.

Another preferred molding composition contains an epoxy resin, a phenol novalac hardener containing a biphenyl or naphthyl moiety, and a transition metal oxide of a Group VIA element. Preferably, the phenol novalac hardener is the only component of the molding composition that contains a biphenyl or naphthyl moiety. More preferably, the composition is substantially free of epoxy resins other than the cresol novalac type.

The preferred weight percent of the epoxy resin ranges from 4 wt % to about 12 wt %, and more preferably, from about 5.5 wt % to about 8.5 wt %, based on the total weight of the molding composition.

There is no particular restriction on the phenol novalac hardener so long as it contains a biphenyl or naphthyl moiety. The phenolic hydroxy groups can be attached to the biphenyl or naphthyl moiety of the hardener. A preferred phenol novalac hardener is commercially available from Meiwa Plastic Industries, Ltd., Japan (catalog no. MEH 7851, SS graded). This type of hardener can also be prepared according to the methods described in EP 915 118 A1. For example, a hardener containing a biphenyl moiety can be prepared by reacting phenol with bismethoxymethylenebiphenyl. The weight percent of the phenol novalac hardener containing a biphenyl or naphthyl moiety can range from 1 wt % to about 10 wt %, and more preferably, from about 1 wt % to about 8 wt %, based on the total weight of the molding composition.

Examples of a transition metal oxide of a Group VIA element include oxides of chromium, molybdenum, and tungsten, with tungsten trioxide being the preferred oxide. The molding composition can include, for example, about 0.25 wt % to about 2 wt %, preferably about 0.5 wt % to about 1 wt %, and more preferably about 0.75 wt % of the transition metal oxide based on the total weight of the molding composition.

Yet another preferred molding composition contains an epoxy resin containing a biphenyl or naphthyl moiety, a phenol novalac hardener, and a transition metal oxide of a Group VIA element. Preferably, the epoxy resin is the only component of the molding composition that contains a biphenyl or naphthyl moiety.

The epoxy resin containing a biphenyl or naphthyl moiety can be obtained commercially, e.g., from Nippon Kayaku Co., Ltd., Japan (catalog no. NC-3000P). The preparation of this type of epoxy resin is also described in EP 915 118 A1. For example, an epoxy resin containing a biphenyl moiety can be prepared by reacting phenol with bismethoxymethylenebiphenyl, followed by treatment with a glycidyl compound such as glycidyl tosylate to form the desired epoxy resin. The preferred weight percent of the epoxy resin containing a biphenyl or naphthyl moiety ranges from 4 wt % to about 12 wt %, and more preferably, from about 5.5 wt % to about 8.5 wt %, based on the total weight of the molding composition.

The preferred weight percent of the phenol novalac hardener ranges from 1 wt % to about 10 wt %, and more preferably, from about 1 wt % to about 8 wt %, based on the total weight of the molding composition.

As described above, a transition metal oxide of a Group VIA element can be an oxide of chromium, molybdenum, and tungsten. Tungsten trioxide is preferred. The molding composition can include, for example, about 0.25 wt % to about 2 wt %, preferably about 0.5 wt % to about 1 wt %, and more preferably about 0.75 wt % of the transition metal oxide based on the total weight of the molding composition.

The molding compositions of this invention can include other additives (the wt % is calculated based on the total weight of the molding composition):

- a filler such as silica, calcium silicate, and aluminum oxide (the preferred molding composition can contain 50–95 wt %, more preferably, 60–90 wt % of a filler);
- a colorant such as carbon black colorant (the preferred molding composition can contain 0.1–2 wt %, more preferably, 0.1–1 wt % of a filler);
- a mold release agent such as camauba wax, paraffin wax, polyethylene wax, glycerol monostearate, and metallic stearates (the preferred molding composition can contain 0.1–2 wt %, more preferably, 0.2–1 wt % of a mold release agent);
- fumed silica such as aerosil (the preferred molding composition can contain 0.3–5 wt %, more preferably, 0.7–3 wt % of a fumed silica);
- a coupling agent such as the silane type coupling agent (the preferred molding composition can contain 0.1–2 wt %, more preferably, 0.3–1 wt % of a coupling agent);
- a catalyst such as 1,8-diazabicyclo-(5,4,0)undecene-7-triphenylphosphone and 2-methyimidazole (the preferred molding composition can contain 0.1–10 wt %, more preferably, 0.5–2 wt % of a catalyst); and
- ion scavengers such as magnesium aluminum carbonate hydrate, which can be obtained commercially from Kyowa Chemical Industry Co. under the trade name "DHT-4A" (the preferred molding composition can contain 0.1–2 wt %, more preferably, 0.5–2 wt % of an ion scavenger).

The molding compositions can be prepared by any conventional method. For example, U.S. Pat. No. 5,476,716 teaches a method of finely groundings, dry blending, and then densifying all of the components of a molding composition on a hot differential roll mill, followed by granulation. Also described in the patent are methods of preparing a molding composition on a laboratory or a pilot plant scale. Alternatively, one can mix the components of a molding composition in a step-wise fashion to enhance homogeneous mixing. Specifically, the first step of the method involves mixing and heating the epoxy resin and the hardener until melting occurs (around 150° C.). The transition metal oxide is then added to the resin and hardener to form a mixture, which is then blended with a mixer until thoroughly mixed (for around 10 minutes). The mixture is allowed to cool until hardened before grounding to a fine powder. The powder is then added to the rest of the components of the molding composition and dry blended before milling. For example, a large two-roll mill (one roll heated to about 90° C., and the other cooled with tap water) can be used to produce uniform sheets, which are then grounded to powder after cooling.

The molding compositions can be molded into various articles by any conventional method, e.g., by using molding apparatus such as a transfer press equipped with a multi-cavity mold for coating electronic devices. Suitable molding conditions include a temperature of about 150° C. to about 200° C. (preferably about 175° C. to about 195° C.) and a pressure of about 400 psi to about 1,500 psi.

The preferred molding compositions cure in about 0.5 minute to about 3 minutes, more preferably, about 1 minute to about 2 minutes. To determine the time for curing (i.e., minimum time needed for forming a good cull cure), the molding composition is placed in the mold press at 190° C. and is inspected after a pre-set period of time (e.g., 3 minutes). If a good cure (i.e., strong and not brittle) is formed, the experiment is repeated with a shorter period of press time until the minimum time period is determined.

The preferred molding compositions demonstrate a flammability rating of UL 94V-1, more preferably, a flammability rating of UL 94V-0. The ratings are determined by measuring the total burn time of a ⅛" bar according to the UL 94 flammability test. A 94V-0 and a 94V-1 rating require the total burn time for a single bar to be less than or equal to 10 s and 30 s, respectively.

Preferably, the inclusion of transition metal oxides in the molding compositions does not increase the rate of moisture absorption, which is determined by a method similar to ASTM D570-95. Briefly, the procedure involves placing a weighed molded disk of 3" diameter and ⅛" thick in a rack in an upright position. The rack is then placed on a platform in an 85° C., 85% relative humidity chamber for a pre-determined time period, and the disk is weighed afterwards. The % weight gain is determined by multiplying the quotient (weight difference of the bar before and after placing in the chamber/initial weight of the bar) by 100%.

The electrical reliability of the coated devices in a moist environment is determined by placing the coated devices, e.g., integrated circuits, with no bias in an autoclave at 121° C., 15 psi, and 100% relative humidity. After a number of hours, the coated devices are dried and tested with an electrical tester. The number of coated devices showing a failure in any one of several electrical parameters is counted. These parameters, set by the manufacturer of the device, include, for example, the net DC input offset current for zero device output, the current from device negative input with zero output, the current from the device positive input terminal with zero output, the average of the two previous parameters, DC input offset voltage for zero device output, etc. The % failure is calculated by multiplying the quotient (number of failed devices/total number of tested devices) by 100%. The preferred molding compositions have good electrical reliability in a moist environment, i.e., less than 50% failure after 1,000 hours under conditions as described above.

The high temperature storage life (HTSL) test assesses electrical reliability of the coated devices in a dry environment (i.e., room humidity) and atmospheric pressure. In the HTSL test, parametric shifts in voltage output levels are monitored, and the coated devices are stored at 200° C. The voltage output levels reflect increased resistance across the ball-bonds of the devices. The preferred molding compositions delay or eliminate the failure due to parameter shifts in voltage output levels of coated devices. Similar to the autoclave test, the % failure is calculated by multiplying the quotient (number of failed devices/total number of tested devices) by 100%. The preferred molding compositions have good electrical reliability in a dry environment, i.e., less than 50% failure after 1,500 hours under conditions as described above.

The following examples of flame retardant molding compositions were prepared by dry blending all of the components simultaneously and testing the compositions.

EXAMPLE 1

Six molding compositions, i.e., 18A–23A, were prepared according to the formulations as indicated in Table 1 below. Each molding composition contained a combination of epoxy cresol novalac resin and biphenyl resin. With the exception of composition 23A, each composition contained two transition metal oxides. The weight % (wt %) indicated below were calculated based on the total weight of the molding composition.

TABLE 1

| Sample | 18A | 19A | 20A | 21A | 22A | 23A |
|---|---|---|---|---|---|---|
| Silica Filler (wt %) | 83.09 | 82.89 | 82.49 | 81.69 | 80.19 | 83.19 |
| Biphenyl Resin (wt %) | 5.34 | 5.34 | 5.34 | 5.34 | 5.34 | 5.34 |
| Epoxy Cresol Novalac Resin (wt %) | 1.00 | 1.00 | 1.00 | 1.00 | 1.00 | 1.00 |
| Fumed Silica (wt %) | 0.40 | 0.40 | 0.40 | 0.40 | 0.40 | 0.40 |
| Carbon Black Colorant (wt %) | 0.30 | 0.30 | 0.30 | 0.30 | 0.30 | 0.30 |
| Limonene Type Hardener (from Yuka Shell) (wt %) | 1.45 | 1.45 | 1.45 | 1.45 | 1.45 | 1.45 |
| Phenol Novalac Hardener (wt %) | 2.47 | 2.47 | 2.47 | 2.47 | 2.47 | 2.47 |
| Catalysts (wt %) | 0.23 | 0.23 | 0.23 | 0.23 | 0.23 | 0.23 |
| Waxes (wt %) | 0.74 | 0.74 | 0.74 | 0.74 | 0.74 | 0.74 |
| Silanes (wt %) | 1.05 | 1.05 | 1.05 | 1.05 | 1.05 | 1.05 |
| Elastomers (wt %) | 1.50 | 1.50 | 1.50 | 1.50 | 1.50 | 1.50 |
| $WO_3$ (wt %) | 0.75 | 0.75 | 0.75 | 0.75 | 0.75 | 0.75 |
| $ZnMoO_4$ (wt %) | 0.10 | 0.30 | 0.70 | 1.50 | 3.00 | 0 |
| Ion Scavenger (wt %) | 1.58 | 1.58 | 1.58 | 1.58 | 1.58 | 1.58 |

Some properties of the cured compositions 18A–23A, i.e., rate of moisture absorption, flammability, and electrical reliability, were determined and summarized below in Table 2. The rate of moisture absorption was measured using a molded disk 3" in diameter and ⅛" in thickness at 85° C. and 85% relative humidity according to the method described above. The flammability properties of the cured compositions were determined by the total burn time of a ⅛" molded bar according to the UL 94 test. The results obtained from two electrical reliability tests were shown here. Specifically, in the autoclave test, forty ALS245 die on nickel/palladium lead frame small outline integrated circuit (SOIC) packages with no bias were coated with molding compositions 18A–23A. The test was conducted at 121° C., 100% relative humidity, and 15 psi pressure for 2,250 hours according to the method described above. In the HTSL test, forty LS00 die on nickel/palladium lead frame SOIC packages were coated with molding compositions 18A–23A. The test was conducted at 200° C., room humidity, and atmospheric pressure for 1,500 hours according to the method described above.

TABLE 2

| Sample | 18A | 19A | 20A | 21A | 22A | 23A |
|---|---|---|---|---|---|---|
| Flammability test (UL 94) | | | | | | |
| Total Burn Time (5 bars) (s) | 60 | >139 | 25 | 29 | 9 | >97 |
| Status | failed | failed | V-1 | V-1 | V-0 | failed |
| Moisture Absorption (%) | | | | | | |
| 16 hours | 0.094 | 0.094 | 0.090 | 0.092 | 0.085 | 0.090 |
| 24 hours | 0.114 | 0.117 | 0.113 | 0.115 | 0.107 | 0.116 |
| 48 hours | 0.168 | 0.171 | 0.166 | 0.169 | 0.163 | 0.171 |

TABLE 2-continued

| Sample | 18A | 19A | 20A | 21A | 22A | 23A |
|---|---|---|---|---|---|---|
| 96 hours | 0.213 | 0.217 | 0.210 | 0.215 | 0.216 | 0.223 |
| 168 hours | 0.250 | 0.255 | 0.250 | 0.258 | 0.268 | 0.269 |
| Autoclave Test (% failure) | | | | | | |
| After 2250 hours of testing | 2.3 | 0.0 | 0.0 | 2.3 | 14.0 | 0.0 |
| HTSL Test (% failure) | | | | | | |
| After 1500 hours of testing | 0.0 | 0.0 | 0.0 | 0.0 | 0.0 | 0.0 |

EXAMPLE 2

Six molding compositions of this invention were prepared according to the formulations as indicated in Table 3 below. Each composition contained epoxy cresol novalac resin as the only epoxy resin. With the exception of Sample 34A, each composition contained a transition metal oxide containing a refractory metal, and a transition metal oxide containing an oxyanion of a Group VIA element. The weight % (wt %) indicated below were calculated based on the total weight of the molding composition.

TABLE 3

| Sample | 34A | 35A | 36A | 37A | 38A | 39A |
|---|---|---|---|---|---|---|
| Silica Filler (wt %) | 81.20 | 81.10 | 80.90 | 80.50 | 79.70 | 78.20 |
| Biphenyl Resin (wt %) | 0.0 | 0.0 | 0.0 | 0.0 | 0.0 | 0.0 |
| Epoxy Cresol Novalac Resin (wt %) | 8.03 | 8.03 | 8.03 | 8.03 | 8.03 | 8.03 |
| Fumed Silica (wt %) | 0.60 | 0.60 | 0.60 | 0.60 | 0.60 | 0.60 |
| Carbon Black Colorant (wt %) | 0.30 | 0.30 | 0.30 | 0.30 | 0.30 | 0.30 |
| Limonene Type Hardener (Yuka Shell) (wt %) | 0.0 | 0.0 | 0.0 | 0.0 | 0.0 | 0.0 |
| Phenol Novalac Hardener (wt %) | 4.58 | 4.58 | 4.58 | 4.58 | 4.58 | 4.58 |
| Catalysts (wt %) | 0.17 | 0.17 | 0.17 | 0.17 | 0.17 | 0.17 |
| Waxes (wt %) | 0.74 | 0.74 | 0.74 | 0.74 | 0.74 | 0.74 |
| Silanes (wt %) | 1.05 | 1.05 | 1.05 | 1.05 | 1.05 | 1.05 |
| Elastomers (wt %) | 1.00 | 1.50 | 1.50 | 1.50 | 1.50 | 1.50 |
| $WO_3$ (wt %) | 0.75 | 0.75 | 0.75 | 0.75 | 0.75 | 0.75 |
| $ZnMoO_4$ (wt %) | 0.00 | 0.10 | 0.30 | 0.70 | 1.50 | 3.0 |
| Ion Scavenger (wt %) | 1.58 | 1.58 | 1.58 | 1.58 | 1.58 | 1.58 |

Some properties of the cured compositions 34A–39A, i.e., rate of moisture absorption, flammability, and electrical reliability, were determined and summarized below in Table 4. These properties were measured according to methods described in Example 1 above.

TABLE 4

| Sample | 34A | 35A | 36A | 37A | 38A | 39A |
|---|---|---|---|---|---|---|
| Flammability test (UL 94) | | | | | | |
| Total Burn Time (5 bars) (s) | >138 | >72 | 41 | 42 | 58 | 9 |

TABLE 4-continued

| Sample | 34A | 35A | 36A | 37A | 38A | 39A |
|---|---|---|---|---|---|---|
| Status | failed | failed | V-1 | V-1 | V-1 | V-0 |
| Moisture Absorption (%) | | | | | | |
| 16 hours | 0.088 | 0.086 | 0.087 | 0.092 | 0.086 | 0.090 |
| 24 hours | 0.122 | 0.119 | 0.119 | 0.124 | 0.115 | 0.118 |
| 48 hours | 0.168 | 0.165 | 0.163 | 0.167 | 0.157 | 0.162 |
| 96 hours | 0.226 | 0.228 | 0.233 | 0.234 | 0.225 | 0.227 |
| 168 hours | 0.237 | 0.237 | 0.245 | 0.235 | 0.237 | 0.238 |
| Autoclave Test (% failure) | | | | | | |
| After 2000 hours of testing | 0.0 | 0.0 | 0.0 | 0.0 | 2.6 | 0.0 |
| HTSL Test (% failure) | | | | | | |
| After 1700 hours of testing | 0.0 | 0.0 | 0.0 | 0.0 | 0.0 | 0.0 |

EXAMPLE 3

Seven comparative molding compositions were prepared according to the formulations as indicated in Table 5 below. With the exception of Sample 40A, each composition contained one transition metal oxide. The remaining six molding compositions contained only one transition metal oxide. Specifically, each of Samples 33A, 41A, and 42A contained a transition metal oxide containing an oxyanion of a Group VIA element, i.e., $ZnMoO_4$, and each of Samples 43A, 44A, and 45A contained a transition metal oxide containing a refractory metal, i.e., $WO_3$. The weight % (wt %) indicated below were calculated based on the total weight of the molding composition.

TABLE 5

| Sample | 40A | 33A | 41A | 42A | 43A | 44A | 45A |
|---|---|---|---|---|---|---|---|
| Silica Filler (wt %) | 83.94 | 83.19 | 82.44 | 80.94 | 83.19 | 82.44 | 80.94 |
| Biphenyl Resin (wt %) | 5.34 | 5.34 | 5.34 | 5.34 | 5.34 | 5.34 | 5.34 |
| Epoxy Cresol Novalac Resin (wt %) | 1.00 | 1.00 | 1.00 | 1.00 | 1.00 | 1.00 | 1.00 |
| Fumed Silica (wt %) | 0.40 | 0.40 | 0.40 | 0.40 | 0.40 | 0.40 | 0.40 |
| Carbon Black Colorant (wt %) | 0.30 | 0.30 | 0.30 | 0.30 | 0.30 | 0.30 | 0.30 |
| Limonene Type Hardener (Yuka Shell) (wt %) | 1.45 | 1.45 | 1.45 | 1.45 | 1.45 | 1.45 | 1.45 |
| Phenol Novalac Hardener (wt %) | 2.47 | 2.47 | 2.47 | 2.47 | 2.47 | 2.47 | 2.47 |
| Catalysts (wt %) | 0.23 | 0.23 | 0.23 | 0.23 | 0.23 | 0.23 | 0.23 |
| Waxes (wt %) | 0.74 | 0.74 | 0.74 | 0.74 | 0.74 | 0.74 | 0.74 |
| Silanes (wt %) | 1.05 | 1.05 | 1.05 | 1.05 | 1.05 | 1.05 | 1.05 |
| Elastomers (wt %) | 1.50 | 1.50 | 1.50 | 1.50 | 1.50 | 1.50 | 1.50 |
| $WO_3$ (wt %) | 0 | 0.75 | 1.50 | 3.00 | 0 | 0 | 0 |
| $ZnMoO_4$ (wt %) | 0 | 0 | 0 | 0 | 0.75 | 1.50 | 3.00 |
| Ion Scavenger (wt %) | 1.58 | 1.58 | 1.58 | 1.58 | 1.58 | 1.58 | 1.58 |

The flammability properties of the cured compositions 33A and 40A–45A were determined as described in Example 1 above and summarized in Table 6 below.

TABLE 6

| Sample | 40A | 33A | 41A | 42A | 43A | 44A | 45A |
|---|---|---|---|---|---|---|---|
| Flammability test (UL 94) | | | | | | | |
| Total Burn Time (5 bars) (s) | 51 | >100 | >138 | >135 | >152 | >166 | >113 |
| Status | failed | failed | failed | Failed | failed | failed | failed |

EXAMPLE 4

Two molding compositions were prepared according to the formulations as indicated in Table 7 below. Each of compositions 17A and 18B contained three transition metal oxides, i.e., $WO_3$, $ZnMoO_4$, and $MoO_3$. The weight % (wt %) indicated below were calculated based on the total weight of the molding composition.

TABLE 7

| Sample | 17A | 18B |
|---|---|---|
| Silica Filler (wt %) | 79.81 | 80.17 |
| Biphenyl Resin (wt %) | 0.0 | 5.34 |
| Epoxy Cresol Novalac Resin (wt %) | 6.10 | 0.0 |
| Fumed Silica (wt %) | 0.80 | 0.60 |
| Carbon Black Colorant (wt %) | 0.30 | 0.30 |
| Phenol Novalac Hardener (wt %) | 4.86 | 4.68 |
| Catalysts (wt %) | 0.24 | 0.22 |
| Waxes (wt %) | 0.74 | 0.74 |
| Silanes (wt %) | 1.05 | 1.05 |
| Elastomers (wt %) | 0.50 | 0.50 |
| $WO_3$ (wt %) | 0.75 | 0.75 |
| $ZnMoO_4$ (wt %) | 3.00 | 3.00 |
| $MoO_3$ (wt %) | 0.75 | 0.75 |
| Ion Scavenger (wt %) | 1.50 | 1.50 |

The flammability properties of the cured compositions 17A and 18B, as well as the time required to form a good cull cure, were determined and summarized in Table 8 below.

TABLE 8

| Sample | 17A | 18B |
|---|---|---|
| Flammability test (UL 94) | | |
| Total burn time (5 bars) (s) | 1 | 4 |
| Status | V-0 | V-0 |
| Minimum time to form a good cull cure (min) | 1.0 | 1.0 |

EXAMPLE 5

Four molding compositions, i.e., 10B, 79A, 81A, and 10B, were prepared according to formulations as indicated in Table 9 below. Each of compositions 79A and 81A contained a phenol novalac hardener containing a biphenyl or naphthyl moiety (available from Meiwa Plastic Industries., Ltd., catalog no. MEH 7851 SS) and a transition metal oxide of a Group VIA element, i.e., $WO_3$. Composition 10B contained an epoxy resin containing a biphenyl or naphthyl moiety (available from Nippon Kayaku Co., Ltd., catalog no. NC-3000P) and a transition metal oxide, i.e., $WO_3$. Composition Sample 80A, on the other hand, only contained a transition metal oxide, i.e., $WO_3$ The weight % (wt %) indicated below were calculated based on the total weight of the molding composition.

TABLE 9

| Sample | 80A | 10B | 79A | 81A |
|---|---|---|---|---|
| Silica Filler (wt %) | 80.78 | 80.78 | 80.78 | 83.45 |
| Biphenyl Resin (wt %) | 0.0 | 0.0 | 0.0 | 5.64 |
| Epoxy Cresol Novalac Resin (wt %) | 8.85 | 0.0 | 7.25 | 0.0 |
| NC-3000P (wt %) | 0.0 | 9.75 | 0.0 | 0.0 |
| Fumed Silica (wt %) | 0.40 | 0.40 | 0.40 | 0.60 |
| Carbon Black Colorant (Wt %) | 0.30 | 0.30 | 0.30 | 0.30 |
| Phenol Novalac Hardener (wt %) | 4.89 | 3.99 | 1.44 | 1.64 |
| MEH 7851 (wt %) | 0.0 | 0.0 | 5.05 | 2.97 |
| Catalysts (wt %) | 0.16 | 0.16 | 0.16 | 0.16 |
| Waxes (wt %) | 0.74 | 0.74 | 0.74 | 0.86 |
| Silanes (wt %) | 1.05 | 1.05 | 1.05 | 1.05 |
| Elastomers (wt %) | 0.50 | 0.50 | 0.50 | 1.00 |
| $WO_3$ (wt %) | 0.75 | 0.75 | 0.75 | 0.75 |
| Ion Scavenger (wt %) | 1.58 | 1.58 | 1.58 | 1.58 |

The flammability properties of the cured compositions 10B and 79A–81A were determined and summarized below in Table 10.

TABLE 10

| Sample | 80A | 10B | 79A | 81A |
|---|---|---|---|---|
| Flammability test (UL 94) | | | | |
| Total burn time (5 bars) (s) | >114 | 2 | 8 | 14 |
| Status | Failed | V-0 | V-0 | V-0 |

EXAMPLE 6

Two molding compositions, 101 and 102, were prepared according to the formulations as indicated in Table 11 below. Each molding composition contained a combination of two transition metal oxides, with Sample 101 including $ZnMoO_4$ as the second transition metal oxide and Sample 102 including $CaMoO_4$ as the second transition metal oxide. The weight % (wt %) indicated below were calculated based on the total weight of the molding composition.

TABLE 11

| Sample | 101 | 102 |
|---|---|---|
| Silica Filler (wt %) | 79.55 | 79.55 |
| Epoxy Cresol Novalac Resin (wt %) | 6.11 | 6.11 |
| Carbon Black Colorant (wt %) | 0.30 | 0.30 |
| Phenol Novalac Hardener (wt %) | 5.30 | 5.30 |
| Catalysts (wt %) | 0.12 | 0.12 |
| Waxes (wt %) | 0.74 | 0.74 |
| Silanes (wt %) | 1.05 | 1.05 |
| Elastomers (wt %) | 1.50 | 1.50 |
| $WO_3$ (wt %) | 0.75 | 0.75 |
| $ZnMoO_4$ (wt %) | 3.00 | 0 |

TABLE 11-continued

| Sample | 101 | 102 |
|---|---|---|
| $CaMoO_4$ (wt %) | 0 | 3.00 |
| Ion Scavenger (wt %) | 1.58 | 1.58 |

The flammability properties, rate of moisture absorption and electrical reliability of the cured compositions 101 and 102 were determined and summarized below in Table 12. The rate of moisture absorption was measured using a molded disk 3" in diameter and ⅛" in thickness at 85° C. and 85% relative humidity according to the method described above. The flammability properties of the cured compositions were determined by the total burn time of a ⅛" molded bar according to the UL 94 test. Also, results from three electrical reliability tests are shown.

Specifically, in the autoclave test, 20 ALS245 die on nickel/palladium lead frame SOIC packages with no bias were coated with molding compositions 101 and 102. The autoclave test was conducted at 121° C., 100% relative humidity, and 15 psi pressure for over 3000 hours according to the method as described above. Additionally, two HTSL tests were conducted, both of which included 20 ALS245 die on nickel/palladium lead frame SOIC packages, which were coated with molding compositions 101 and 102. The first HTSL test was conducted at 200° C., room humidity, and atmosphere pressure for over 3200 hours. The second HTSL test was conducted under similar conditions, with the exception that the temperature was 210° C.

TABLE 12

| Sample | 101 | 102 |
|---|---|---|
| Flammability test (UL 94) | | |
| Total Burn Time (5 bars) (s) | 0 | 23 |
| Status | V-0 | V-0 |
| Moisture Absorption (%) | | |
| 24 hours | 0.116 | 0.119 |
| 48 hours | 0.180 | 0.179 |
| 96 hours | 0.245 | 0.230 |
| 168 hours | 0.297 | 0.262 |
| Autoclave Test (% failure) | | |
| 94 hours | 2.4 | 0 |
| 385 hours | 2.4 | 0 |
| 1010 hours | 2.4 | 0 |
| 1460 hours | 2.4 | 0 |
| 1655 hours | 2.4 | 8.6 |
| 1960 hours | 2.4 | 8.6 |
| 2073 hours | 2.4 | 11.4 |
| 2691 hours | 21.4 | 40.0 |
| 3064 hours | 42.9 | 65.7 |
| HTSL Test 1 @ 200° C. (% failure) | | |
| 132 hours | 0 | 0 |
| 572 hours | 0 | 0 |
| 1100 hours | 0 | 0 |
| 1584 hours | 2.1 | 0 |
| 2288 hours | 2.1 | 0 |
| 3234 hours | 8.3 | 18.8 |
| HTSL Test 1 @ 200° C. (% failure) | | |
| 132 hours | 0 | 0 |
| 572 hours | 0 | 0 |

TABLE 12-continued

| Sample | 101 | 102 |
|---|---|---|
| 1100 hours | 0 | 0 |
| 1584 hours | 2.8 | 0 |
| 2288 hours | 2.8 | 0 |
| 3234 hours | 25.0 | 10.0 |

As is apparent, the molding compositions of Sample 101, including $ZnMoO_4$ in combination with $WO_3$, and Sample 102, including $CaMoO_4$ in combination with $WO_3$, both passed flammability testing. In addition, both molding compositions demonstrated favorable moisture absorption, with the molding composition of Sample 102 which includes $CaMoO_4$ in combination with $WO_3$ having a lower moisture absorption after 48 hours than the molding composition of Sample 101 including $ZnMoO_4$ in combination with $WO_3$.

Also, the electrical reliability testing demonstrates acceptable failure levels for the molding compositions of Sample 101 and 102. In particular, the electrical reliability data above was plotted using a standard Weibull Distribution to obtain a statistically determined time to reach 50% failure±95% confidence interval. Such plotting obtained a 50% failure time of 3350±430 hours for Sample 101, and a 50% failure time of 2830±210 hours for Sample 102. These results demonstrate no statistical difference (at 95% confidence) in the time to reach 50% failure for Samples 101 and 102.

Other embodiments are within the claims.

What is claimed is:

1. A flame retardant molding composition substantially free of halogen, phosphorus, and antimony, comprising an epoxy resin, a first transition metal oxide containing a refractory metal, and a second transition metal oxide containing an oxyanion of a Group VIA element and a cation of a Group IIA element.

2. The molding composition of claim 1, wherein the Group IIA element is calcium.

3. The molding composition of claim 2, wherein the oxyanion is molybdate.

4. The molding composition of claim 1, wherein the second transition metal oxide is in a free form.

5. The molding composition of claim 1, wherein the refractory metal is selected from the group consisting of zirconium, niobium, molybdenum, ruthenium, iridium, hafnium, tantalum, tungsten, osmium, vanadium, chromium, rhenium, and rhodium.

6. The molding composition of claim 5, wherein the refractory metal is chromium, molybdenum, or tungsten.

7. The molding composition of claim 6, wherein the first transition metal oxide is tungsten trioxide.

8. The molding composition of claim 1, wherein the amount of the first transition metal oxide ranges from about 0.25 wt % to about 2 wt %, and the amount of the second transition metal oxide ranges from about 0.70 wt % to about 6 wt % based on the total weight of the molding composition.

9. The molding composition of claim 8, wherein the amount of the first transition metal oxide ranges from about 0.5 wt % to about 1 wt %, and the amount of the second transition metal oxide ranges from about 1 wt % to about 4 wt % based on the total weight of the molding composition.

10. The molding composition of claim 9, wherein the amount of the first transition metal oxide is about 0.75 wt %, and the amount of the second transition metal oxide is about 3 wt % based on the total weight of the molding composition.

11. The molding composition of claim 1, further comprising a third transition metal oxide of a Group VIA element.

12. The molding composition of claim 11, wherein the third transition metal oxide is molybdenum trioxide.

13. The molding composition of claim 12, wherein the amount of the third transition metal oxide ranges from about 0.1 wt % to about 1 wt % based on the total weight of the molding composition.

14. The molding composition of claim 1, further comprising a phenol novalac hardener.

15. The molding composition of claim 14, wherein the amount of the phenol novalac hardener ranges from about 1.5 wt % to about 6 wt % based on the total weight of the molding composition.

16. The molding composition of claim 1, wherein the molding composition contains an epoxy cresol novalac resin.

17. The molding composition of claim 16, wherein the molding composition further contains a biphenyl epoxy resin.

18. The molding composition of claim 1, wherein the amount of the epoxy resin ranges from about 4 wt % to about 12 wt % based on the total weight of the molding composition.

19. The molding composition of claim 18, wherein the amount of the epoxy resin ranges from about 5.5 wt % to about 8.5 wt % based on the total weight of the molding composition.

20. A flame retardant molding composition substantially free of halogen, phosphorous, and antimony, comprising an epoxy resin, a refractory transition metal oxide, and calcium molybdate.

21. The molding composition of claim 20, wherein the refractory transition metal oxide is tungsten trioxide.

22. A method of preparing a flame retardant polymer composition which is free of halogen, phosphorus, and antimony, comprising heating a molding composition to a temperature sufficient to cure the molding composition, the molding composition including an epoxy resin, a first transition metal oxide containing a refractory metal, and a second transition metal oxide containing an oxyanion of a Group VIA element and a cation of a Group IIA element.

23. The method of claim 22, wherein the first transition metal oxide is tungsten trioxide, and the second transition metal oxide is calcium molybdate.

24. The method of claim 23, wherein the calcium molybdate is in a free form and is not associated with any other material.

25. The method of claim 22, wherein the amount of the first transition metal oxide is about 0.75 wt %, and the amount of the second transition metal oxide is about 3 wt % based on the total weight of the molding composition.

26. The method of claim 22, wherein the amount of the epoxy resin ranges from about 4 wt % to about 12 wt % based on the total weight of the molding composition.

27. The method of claim 22, wherein the temperature ranges from about 165° C. to about 195° C.

28. A method of coating an electrical or electronic device comprising heating a molding composition to a temperature sufficient to cure the molding composition and form a polymer on the surface of the device, the molding composition, which is substantially free of halogen, phosphorus, and antimony, containing an epoxy resin, a first transition metal oxide containing a refractory metal, and a second transition metal oxide containing an oxyanion of a Group VIA element and a cation of a Group IIA element.

29. The method of claim 28, wherein the first transition metal oxide is tungsten trioxide, and the second transition metal oxide is calcium molybdate.

30. The method of claim 29, wherein the calcium molybdate is in a free form and is not associated with any other material.

31. The method of claim 28, wherein the amount of the first transition metal oxide is about 0.75 wt %, and the amount of the second transition metal oxide is about 3 wt % based on the total weight of the molding composition.

32. The method of claim 28, wherein the amount of the epoxy resin ranges from about 4 wt % to about 12 wt % based on the total weight of the molding composition.

33. The method of claim 28, wherein the temperature ranges from about 165° C. to about 195° C.

34. The method of claim 28, the device being a semiconductor, a transistor, a diode, or an integrated circuit.

35. An electrical or electronic device formed by the method of claim 28.

* * * * *